United States Patent
O'Sullivan et al.

(10) Patent No.: US 10,049,802 B2
(45) Date of Patent: Aug. 14, 2018

(54) PATTERNING MAGNETIC FILMS USING SELF-STOP ELECTRO-ETCHING

(71) Applicant: International Business Machines Corporation, Armonk, NY (US)

(72) Inventors: Eugene J. O'Sullivan, Nyack, NY (US); David L. Rath, Stormville, NY (US); Naigang Wang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/587,685

(22) Filed: May 5, 2017

(65) Prior Publication Data

US 2018/0102207 A1    Apr. 12, 2018

Related U.S. Application Data

(63) Continuation of application No. 15/290,469, filed on Oct. 11, 2016, now Pat. No. 9,735,224.

(51) Int. Cl.

| | |
|---|---|
| H01L 29/00 | (2006.01) |
| H01F 10/16 | (2006.01) |
| H01F 27/28 | (2006.01) |
| H01F 27/24 | (2006.01) |
| H01F 7/06 | (2006.01) |
| H01F 41/04 | (2006.01) |
| H01L 49/02 | (2006.01) |

(52) U.S. Cl.
CPC .............. *H01F 10/16* (2013.01); *H01F 7/06* (2013.01); *H01F 27/24* (2013.01); *H01F 27/2804* (2013.01); *H01F 41/041* (2013.01); *H01L 28/10* (2013.01)

(58) Field of Classification Search
CPC . H01F 10/16; H01F 7/06; H01F 27/24; H01F 27/2804; H01F 41/041; H01L 28/10; H01L 23/5227; H01L 27/0288
USPC .......................................................... 257/531
See application file for complete search history.

(56) References Cited

U.S. PATENT DOCUMENTS

| | | | |
|---|---|---|---|
| 5,673,163 A | * | 9/1997 | Cohen ................. G11B 5/3103 360/125.51 |
| 6,518,165 B1 | | 2/2003 | Yoon et al. |
| 6,607,934 B2 | | 8/2003 | Chang et al. |
| 7,463,131 B1 | | 12/2008 | Hwang et al. |
| 7,867,787 B2 | | 1/2011 | Gardner et al. |
| 8,236,160 B2 | | 8/2012 | Basol |

(Continued)

FOREIGN PATENT DOCUMENTS

WO    2010147120 A1    12/2010

OTHER PUBLICATIONS

U.S. Appl. No. 15/290,469, filed Oct. 11, 2016.

(Continued)

*Primary Examiner* — Tu-Tu Ho
(74) *Attorney, Agent, or Firm* — Vazken Alexanian; Ryan, Mason & Lewis, LLP

(57) ABSTRACT

A semiconductor structure includes a substrate and a patterned magnetic feature disposed over a top surface of the substrate. The patterned magnetic feature is a magnetic material, and has undercut sidewalls providing a self-stop for electro-etching of the magnetic material. The semiconductor structure may form a closed-yoke inductor or a solenoid inductor.

20 Claims, 8 Drawing Sheets

(56) References Cited

U.S. PATENT DOCUMENTS

| | | | |
|---|---|---|---|
| 8,338,920 B2 | 12/2012 | Cotte et al. | |
| 9,064,507 B1 | 6/2015 | Pakala et al. | |
| 9,105,627 B2 | 8/2015 | Shapiro et al. | |
| 9,633,866 B2* | 4/2017 | Shulver | H01L 21/32134 |
| 9,735,224 B1* | 8/2017 | O'Sullivan | H01L 28/10 |
| 2008/0003698 A1 | 1/2008 | Park et al. | |
| 2014/0239443 A1 | 8/2014 | Gallagher et al. | |
| 2016/0343586 A1* | 11/2016 | Shulver | H01L 21/32134 |

OTHER PUBLICATIONS

D.S. Gardner et al., "Integrated On-Chip Inductors Using Magnetic Materials," Journal of Applied Physics, Apr. 2008, pp. 6 pages, vol. 103, No. 7.

N. Wang et al., "Integrated On-Chip Inductors with Electroplated Magnetic Yokes (Invited)," Journal of Applied Physics, Mar. 13, 2012, pp. 07E732-1-07E732-7, vol. 111.

X. Xing et al., "High-Bandwidth Low-Insertion Loss Solenoid Transformers Using FeCoB Multilayers," IEEE Transactions on Power Electronics, Sep. 2013, pp. 4395-4401, vol. 28, No. 9.

V. Pulijala et al., "Performance Boost of Spiral Inductors with Thickness-Controlled Domain-Patterned Permalloy," IEEE Transactions on Magnetics, May 2015, 5 pages.

D.S. Gardner et al., "Integrated On-Chip Inductors with Magnetic Films," IEEE Transactions on Magnetics, Jun. 2007, pp. 2615-2617, vol. 43, No. 6.

N. Wang et al., "Micro-Inductors Integrated on Silicon for Power Supply on Chip," Journal of Magnetism and Magnetic Materials, Sep. 2007, pp. e233-e237, vol. 316.

D.W. Lee et al., "Effects of Geometries on Permeability Spectra of CoTaZr Magnetic Cores for High Frequency Applications," Journal of Applied Physics, Feb. 2008, 3 pages, vol. 103, No. 7.

English translation for Application No. WO2010147120A1.

List of IBM Patents or Patent Applications Treated as Related, U.S. Appl. No. 15/290,469 and U.S. Appl. No. 15/587,685.

* cited by examiner

100

200

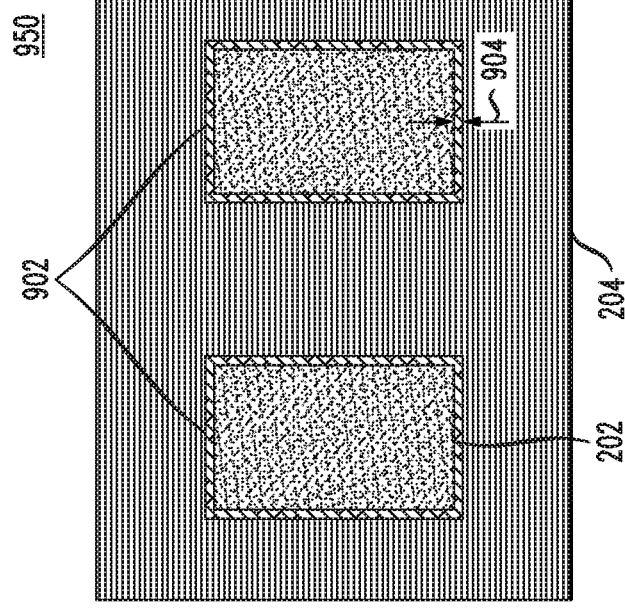
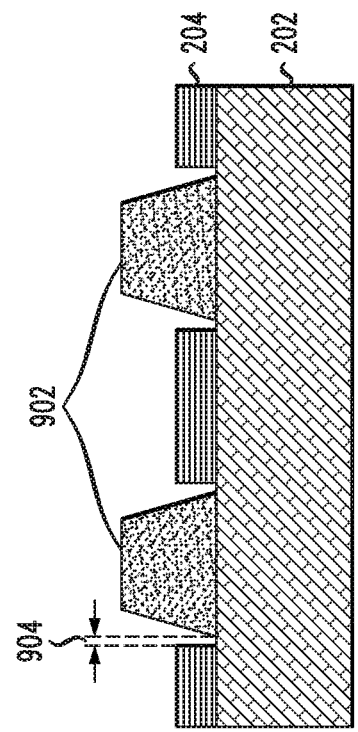
FIG. 9
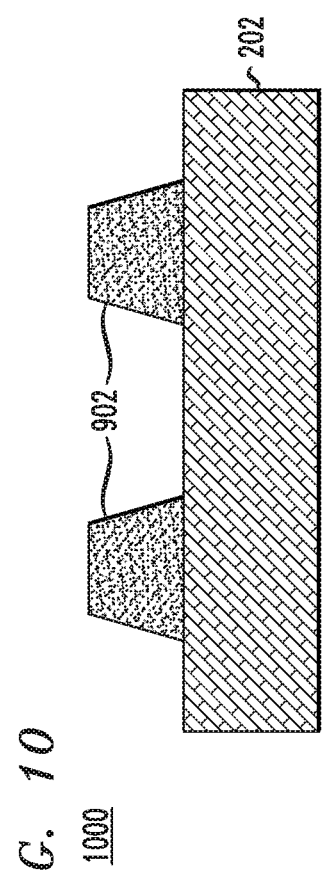
FIG. 10

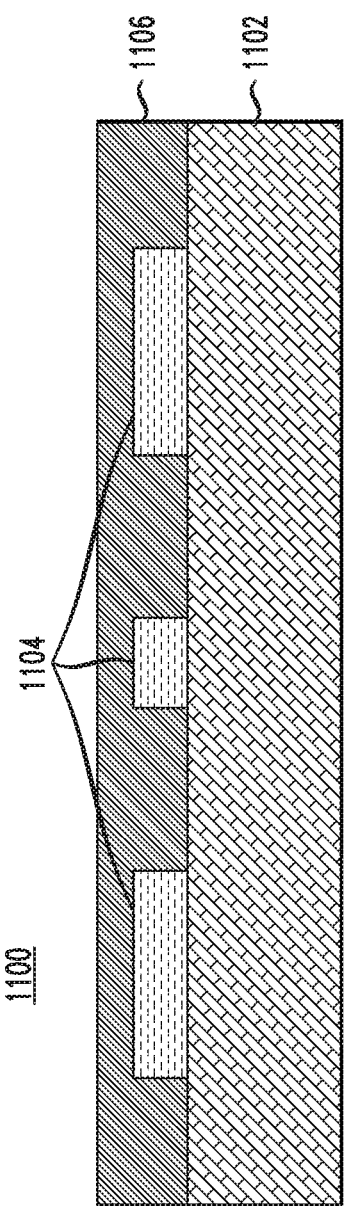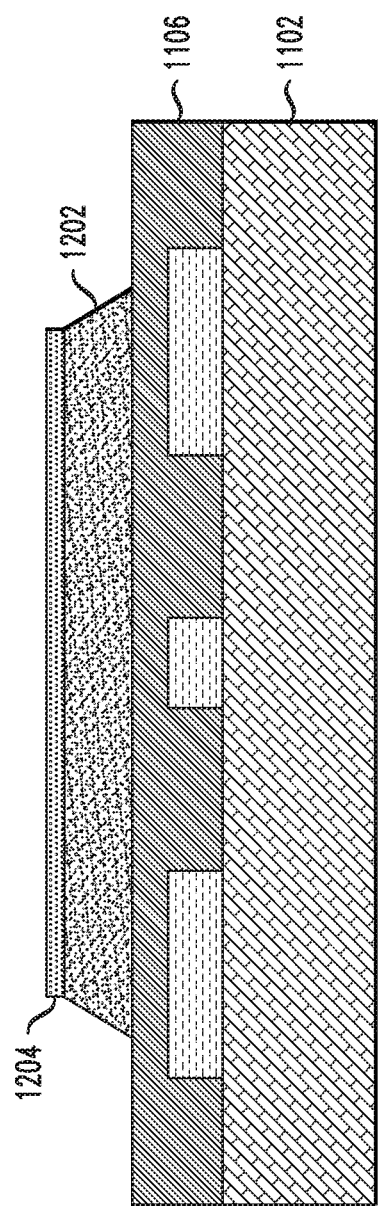

1300

1400

1500

1600

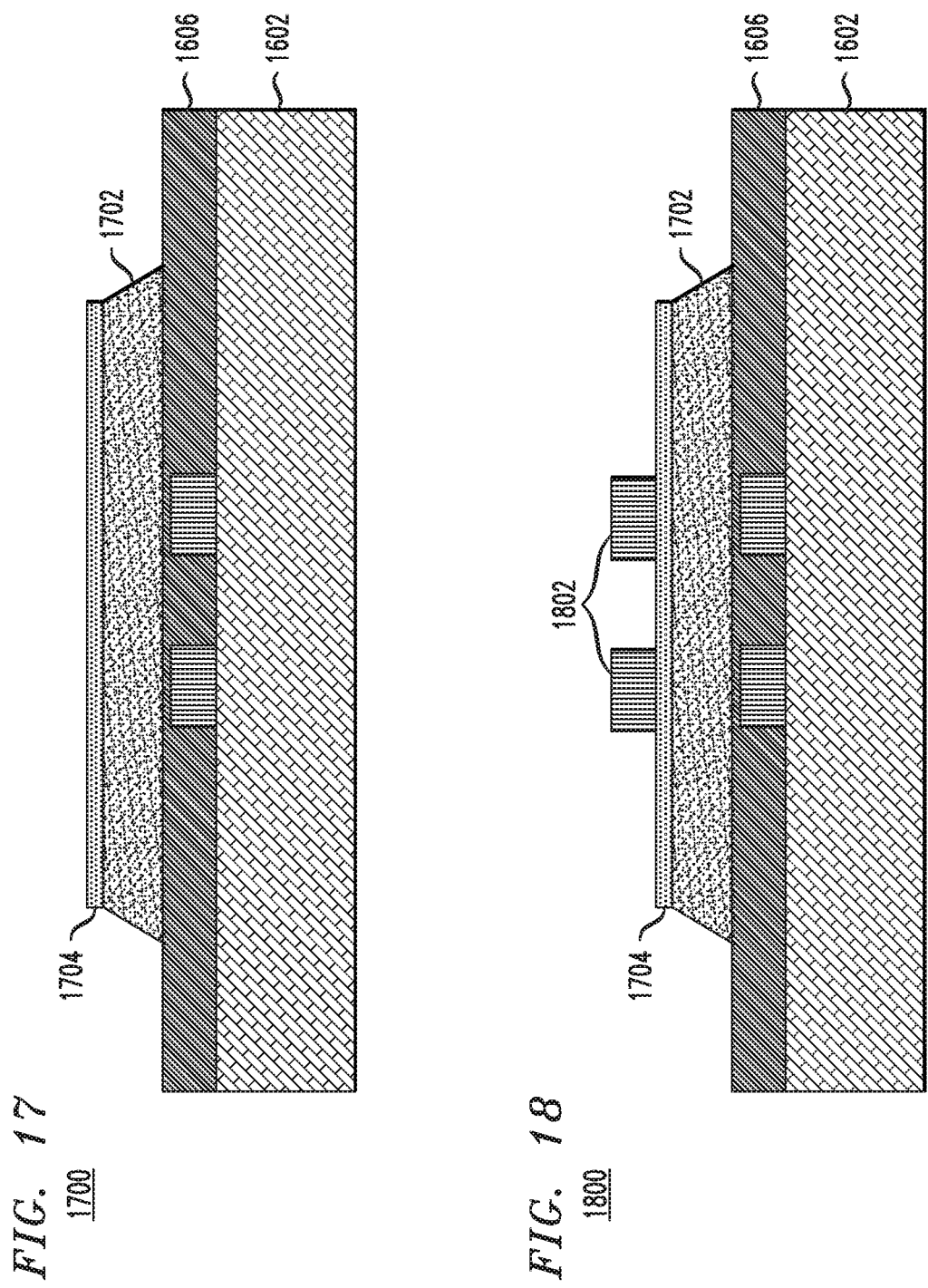

PATTERNING MAGNETIC FILMS USING SELF-STOP ELECTRO-ETCHING

BACKGROUND

The present application relates to semiconductors, and more specifically, to techniques for forming semiconductor structures. Inductors and transformers are examples of passive elements which may be formed on semiconductor structures or chips. Such passive elements may be used in a wide variety of applications.

SUMMARY

Embodiments of the invention provide techniques for patterning magnetic films using self-stop electro-etching.

For example, in one embodiment a semiconductor structure comprises a substrate and at least one patterned magnetic feature disposed over a top surface of the substrate. Said at least one patterned magnetic feature comprises a magnetic material. Said at least one patterned magnetic feature comprises undercut sidewalls, the undercut sidewalls providing a self-stop for electro-etching of the magnetic material.

In another embodiment, an integrated circuit comprises a semiconductor structure comprising a substrate and at least one patterned magnetic feature disposed over a top surface of the substrate. Said at least one patterned magnetic feature comprises a magnetic material. Said at least one patterned magnetic feature comprises undercut sidewalls, the undercut sidewalls providing a self-stop for electro-etching of the magnetic material.

BRIEF DESCRIPTION OF THE DRAWINGS

FIG. 9 depicts a side cross-sectional view and top-down view of the FIG. 8 structure following the electro-etching of the magnetic material and removal of the photoresist and protect layer, according to an embodiment of the present invention.

FIG. 10 depicts a side cross-sectional view of the FIG. 9 structure following removal of the seed layer, according to an embodiment of the present invention.

FIG. 11 depicts a side cross-sectional view of a substrate having one or more transistors formed thereon with the transistors and top surface of the substrate surrounded by a dielectric layer, according to an embodiment of the present invention.

FIG. 12 depicts a side cross-sectional view of the FIG. 11 structure following formation of a bottom yoke utilizing self-stopping electro-etching of magnetic material, according to an embodiment of the present invention.

FIG. 17 depicts a side cross-sectional view of the FIG. 16 structure following formation of a magnetic core over the dielectric layer utilizing self-stopping electro-etching of magnetic material, according to an embodiment of the present invention.

FIG. 18 depicts a side cross-sectional view of the FIG. 17 structure following formation of metal wiring over a dielectric formed over the magnetic core, according to an embodiment of the present invention.

DETAILED DESCRIPTION

Figure 1:
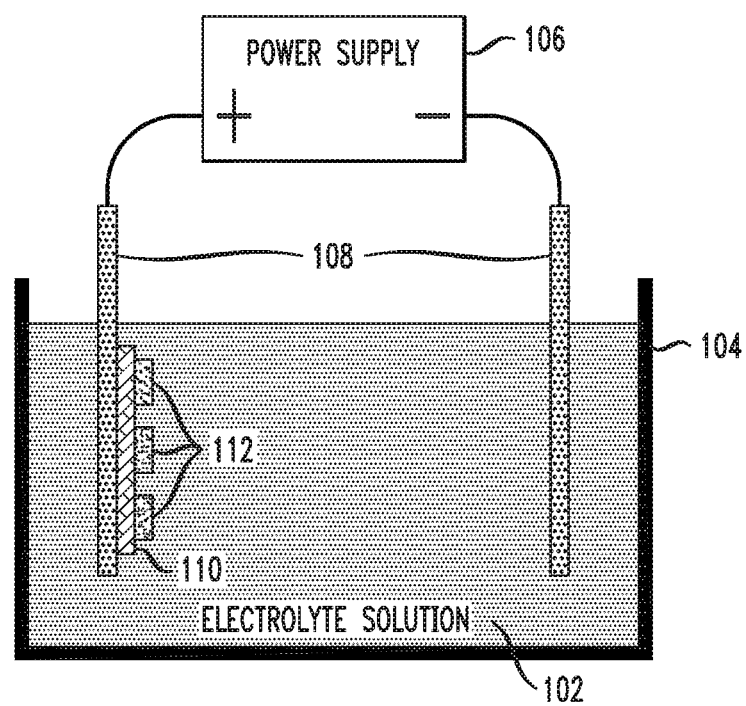
FIG. 1 depicts a side cross-sectional view of an electrochemical etching, according to an embodiment of the present invention.

Illustrative embodiments of the invention may be described herein in the context of illustrative methods for forming magnetic films via electrochemical etching, along with illustrative apparatus, systems and devices having magnetic films formed using such methods. However, it is to be understood that embodiments of the invention are not limited to the illustrative methods, apparatus, systems and devices but instead are more broadly applicable to other suitable methods, apparatus, systems and devices.

In various semiconductor structures, on-chip magnetic inductors and/or transformers are important passive elements in a wide variety of applications including but not limited to on-chip power converters and radio frequency (RF) integrated circuits.

Magnetic inductors may be composed of a set of coils, usually formed of copper, to carry currents along with a magnetic yoke or core that stores magnetic energy. The amount of energy that can be stored in the magnetic core is directly related to the volume of magnetic material. For on-chip applications where the dimensions of inductors may be small, thick magnetic films such as magnetic films in the range of 1-10 micrometer (μm) thickness may be desired to meet energy storage requirements.

Thick magnetic films, which are usually metal films, may be deposited using various techniques including plating and sputtering. Often, high-performance magnetic materials are deposited by sputtering due to its wide choice of materials systems and precise control of microstructures, e.g., lamination. However, unlike plating which can plate magnetic materials into a pre-patterned mold, sputtering will deposit magnetic films on a whole substrate. The magnetic film then must be etched back for patterning after deposition.

Etching and patterning methods may include those based on dry etchings such as ion-beam etching (IBE) and reactive-ion etching (RIE). Dry etchings, however, tend to have a very low etching rate and are thus more suitable for thin films, e.g., films with thickness less than 500 nanometers (nm). As an example, IBE and RIE may be time consuming such as requiring approximately 8 hours to etch 1 micron of magnetic material. Thus, using dry etching methods to pattern thick magnetic films may require an impractically long etching time. In addition, dry etching presents challenges such as re-deposition on sidewalls, overheating on material surface, etc.

Etching and patterning methods may also utilize wet etching. Wet etching may be isotropic, providing for etching in- and out-of-plane at the same time. It can be difficult, however, to control patterning using wet etching. For example, directly patterning a photoresist mask followed by wet etching using strong chemicals can cause severe and uncontrollable undercuts especially for processing of large wafers used in semiconductor processing.

In some embodiments, one or more of the above-described and other challenges in patterning magnetic films are met using techniques for patterning thick magnetic films with electro-etching. Unlike a traditional electro-etching, a seed layer such as a copper (Cu) film protected by tantalum (Ta) is deposited and patterned before sputtering a thick magnetic film. The continuous seed layer ensures that current is delivered across an entire wafer until completion of the etching of field materials. The patterns in the seed layer also create a self-stopping etching mechanism so that the shape and edges of each magnetic core feature are well controlled. Embodiments provide a number of advantages for patterning thick magnetic films, including but not limited to providing a simple and low cost process with a fast etching rate that allows precise control of the patterned shapes and edges of magnetic films that easily scale up to large wafers.

FIG. 1 shows a side cross-sectional view 100 of an electrochemical etching. As shown, an electrolyte solution 102 is placed in a container 104. A power supply 106 is shown with cathodes and anodes attached to electrodes 108 that extend into the electrolyte solution 102 in container 104. A substrate 110 is attached to one of the electrodes 108, with the substrate 110 having magnetic films 112 formed thereon. The cathodes and anodes may be used to deposit or etch material, such as etching the magnetic films 112. The substrate 110 may be, for example a silicon (Si) wafer such as a 300 millimeter (mm) Si wafer with a thickness in the range of 750-800 μm in some embodiments. The magnetic films 112 in some embodiments may be formed of a nickel-iron (Ni—Fe) alloy, a cobalt-iron (Co—Fe) alloy, a nickel-cobalt-iron (Ni—Co—Fe) alloy, a cobalt-iron-boron (Co—Fe—B) alloy, a cobalt-zirconium-tantalum (Co—Zr—Ta) alloy, a cobalt-zirconium-titanium (Co—Zr—Ti) alloy, a cobalt-zirconium-iron-boron (Co—Zr—Fe—B) alloy or other soft magnetic metal. The magnetic films 112 may be thick, such as having a thickness in the range of 1-10 μm in some embodiments.

Figure 2:
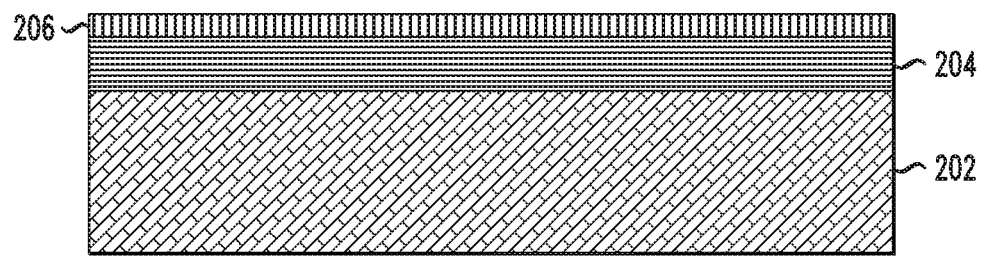
FIG. 2 depicts a side cross-sectional view of seed and protect layers formed over a substrate, according to an embodiment of the present invention.

FIGS. 2-10 described below illustrate a process for patterning thick magnetic films using a self-stopping electro-etching. FIG. 2 shows a side cross-sectional view 200 of a structure including a substrate 202 with a seed layer 204 formed over the substrate 202 and a protect layer 206 formed over the seed layer 204. The substrate 202, similar to substrate 110, may be a Si wafer such as a 300 mm wafer with a thickness in the range of 750-800 μm. The seed layer 204 and protect layer 206 may be formed by physical vapor deposition (PVD) in some embodiments, although other suitable techniques may be used in other embodiments.

In some embodiments, the seed layer 204 is Cu. In other embodiments, various other materials including but not limited to gold (Au) may be used for the seed layer 204. The seed layer 204 may have a thickness in the range of 100-500 nm in some embodiments.

In some embodiments, the protect layer 206 is Ta. In other embodiments, various other materials including but not limited to titanium (Ti) may be used for the protect layer 206. Ti may be used for the protect layer 206 if the electrolyte solution does not contain hydrofluoric acid (HF). The protect layer 206 may have a thickness in the range of 10-100 nm in some embodiments.

Figure 3:
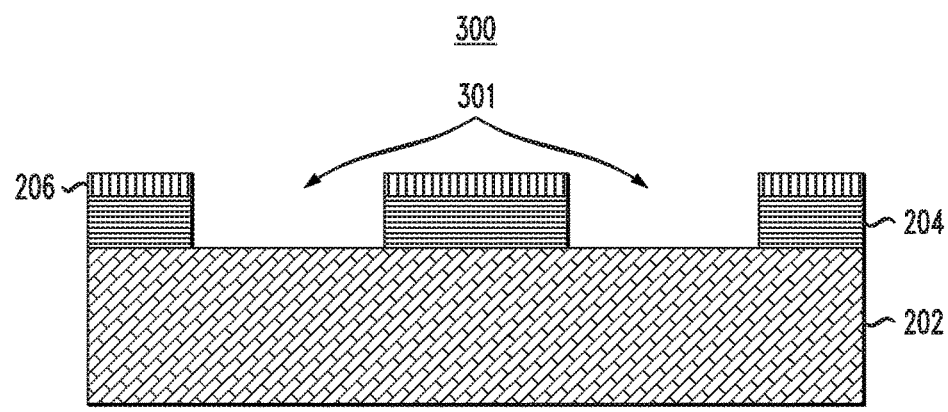
FIG. 3 depicts a side cross-sectional view of the FIG. 2 structure following patterning of the seed and protect layers, according to an embodiment of the present invention.

FIG. 3 shows a side cross-sectional view 300 of the FIG. 2 structure following patterning of the seed layer 204 and the protect layer 206 to form openings 301. Various processes may be used for patterning the seed layer 204 and protect layer 206, including but not limited to RIE or wet etching techniques. Although FIG. 2 shows an example wherein two openings 301 are formed, embodiments are not limited to this arrangement. In other embodiments, more or fewer than two openings may be formed in the seed layer 204 and protect layer 206 as desired. In addition, while FIG. 3 shows an arrangement in which each of the openings 301 is of the same width, this is not a requirement. In other embodiments, different openings in the seed layer 204 and protect layer 206 may be of different sizes and/or shapes.

Figure 4:
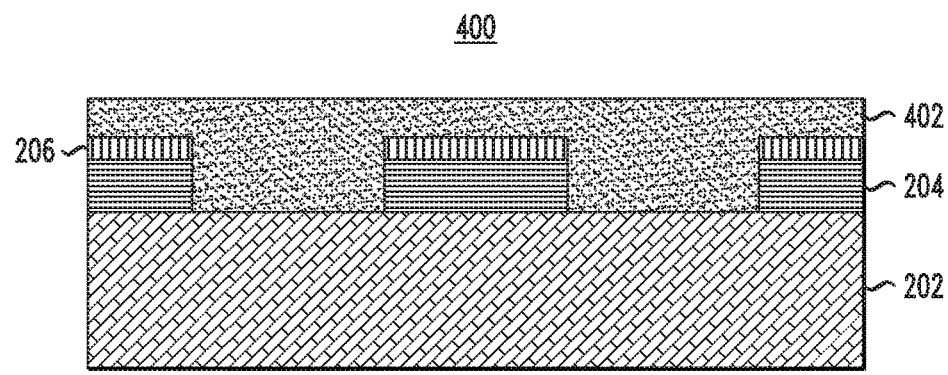
FIG. 4 depicts a side cross-sectional view of the FIG. 3 structure following formation of a magnetic film, according to an embodiment of the present invention.

FIG. 4 shows a side cross-sectional view 400 of the FIG. 3 structure following formation of a magnetic film 402 over the openings 301 and over the top surface of the protect layer 206. The magnetic film 402 may be formed using sputtering in some embodiments, although other suitable processes such as PVD, pulsed laser deposition, evaporative deposition, etc. may be used in other embodiments. The magnetic film 402 may comprise a magnetic material such as Ni—Fe, Co—Fe, Ni—Co—Fe, Co—Fe—B, Co—Zr—Ta, Co—Zr—Ti, Co—Zr—Fe—B or another soft magnetic metal. The magnetic film 402 may have a thickness, measured from the top surface of the substrate 202 (e.g., the bottom of the openings 301) in the range of 1-10 μm in some embodiments.

Figure 5:
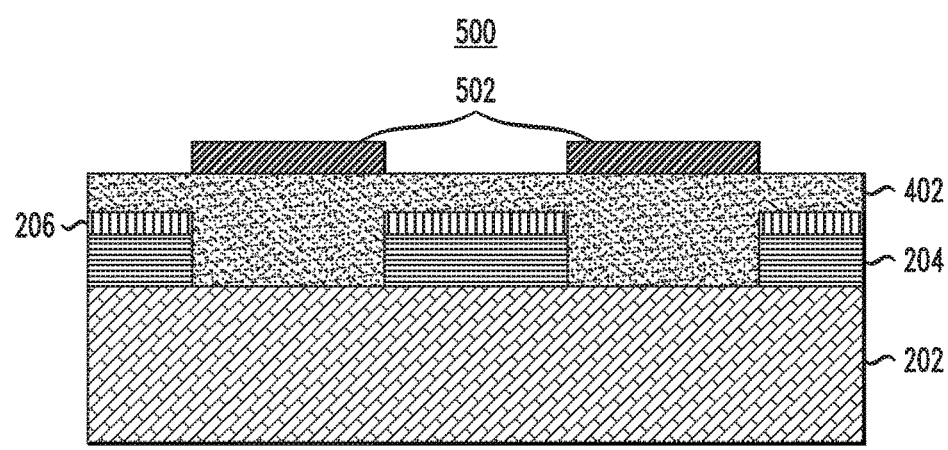
FIG. 5 depicts a side cross-sectional view of the FIG. 4 structure following patterning of a photoresist over portions of the magnetic film, according to an embodiment of the present invention.

FIG. 5 shows a side cross-sectional view 500 of the FIG. 4 structure following patterning of photoresist 502 over portions of the magnetic film 402. In the FIG. 5 example, the photoresist 502 is patterned so as to cover the openings 301 defined in the seed layer 204 and protect layer 206. This is not a requirement, however, and photoresist may be formed to cover only portions of one or more of the openings 301 in other embodiments. The photoresist 502 is not required to be exactly aligned to the edge of the opening 301, and may be slightly smaller in some embodiments such as 5-10 μm inside of the opening 301. The magnetic features, and thus the size of the opening 301, is often comparatively large such as in the range of 100s of μm so that 5-10 μm on the edge difference between the photoresist 502 and the opening 301 is acceptable in some embodiments.

Figure 6:
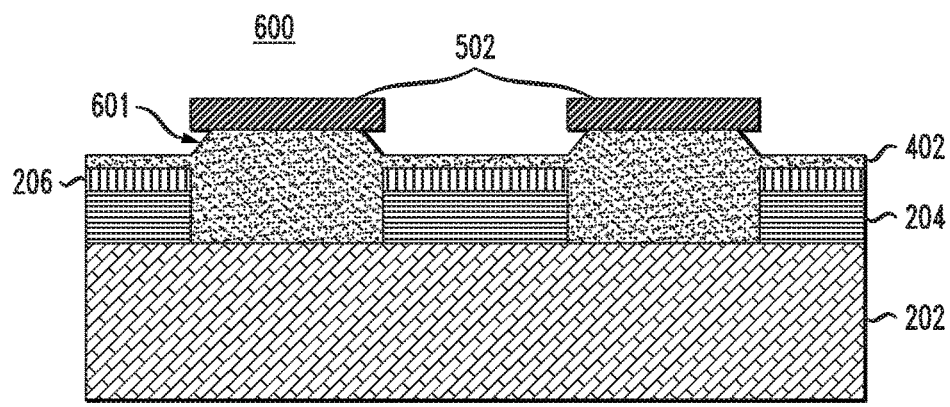
FIG. 6 depicts a side cross-sectional view of the FIG. 5 structure following electro-etching of the magnetic material, according to an embodiment of the present invention.
Figure 7:
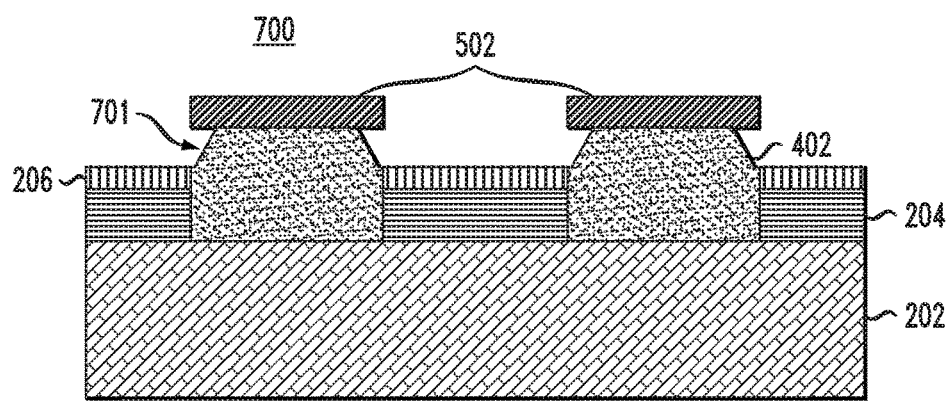
FIG. 7 depicts a side cross-sectional view of the FIG. 6 structure following further electro-etching of the magnetic material, according to an embodiment of the present invention.
Figure 8:
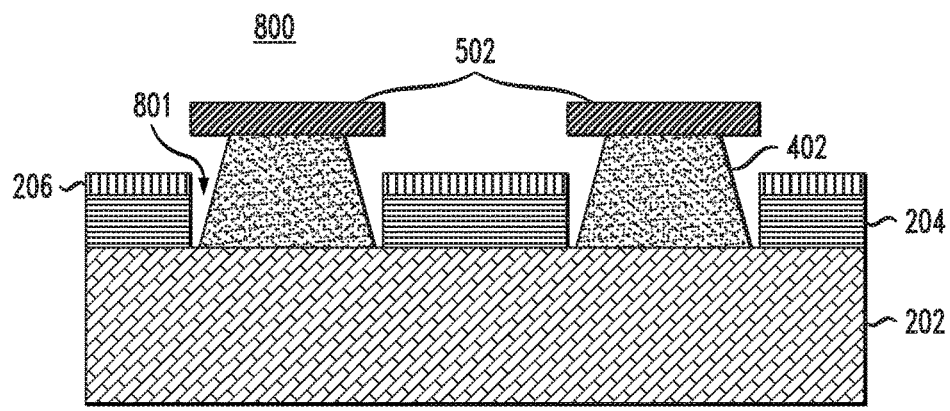
FIG. 8 depicts a side cross-sectional view of the FIG. 7 structure following self-stopping of the electro-etching of the magnetic material, according to an embodiment of the present invention.

FIGS. 6-8 illustrate electro-etching of the magnetic material 402.

FIG. 6 shows a side cross-sectional view 600 of the FIG. 5 structure, wherein the electro-etching starts from the top surface of the magnetic film 402 and slightly undercuts the photoresist 502 as illustrated by element 601. The seed layer 302 delivers current from an external power supply to facilitate the electro-etching. The slight undercut shown by element 601 is due to the feature dimension (in-plane) being much larger than the film thickness (out-of-plane).

FIG. 7 shows a side cross-sectional view 700 of the FIG. 6 structure as the electro-etching continues. As shown, when the opened magnetic material is etched away the undercut continues as illustrated by element 701.

FIG. 8 shows a side cross-sectional view 800 of the FIG. 7 structure illustrating self-stopping of the electro-etching. Further undercut, as illustrated in element 801, stops once a small gap is formed between the magnetic material and the seed layer 204, as no etching current is able to reach the magnetic material Magnetic layers may be floated in inductor and/or transformer devices, which means that magnetic layers are not physically connected to any other metal layers. Therefore, the patterned seed layer 204 may be continuous across the whole wafer or substrate 202 with the exception of the openings 301 formed therein to define magnetic features. The protect layer 106, which may be formed of Ta, can form a tantalum oxide (TaOx) surface once contacting the electrolyte solution 102 to protect the seed layer 204 from being etched away. The protected and continuous seed layer 204 ensures etching of the field magnetics to be completed across the wafer or substrate 202. The pre-patterned seed layer 204 allows the self-stopping mechanism, ensuring that the magnetic features have undercut shapes as illustrated.

FIG. 9 depicts a side cross-sectional view 900 and a top-down view 950 of the FIG. 8 structure following the electro-etching of the magnetic film 402 and removal of the photoresist 502 and protect layer 206. As shown, the electro-etching of the magnetic film 402 permits formation of the patterned magnetic features 902. As illustrated in the top-down view 950, the patterned magnetic features 902 are separated from the continuous seed layer 204 with a gap 904 providing the self-stop for the electro-etching.

The electrolyte solution used for the electro-etching may comprise an acid solution, such as hydrochloric acid, sulfuric acid, dilute sulfuric, phosphoric, trifluoromethane sulfonic (TFMSA), citric, acetic related acids, etc. In some embodiments, the electrolyte solution is acidic or neutral, such as a diluted acid solution with one or more of Ni or an Fe-based salt such as $NiCl_2$. The electrolyte solution may in some embodiments be tailored to the type of magnetic layer being etched. A Ni—Fe type alloy, for example, is not readily chemically etched and does not undergo chemical dissolution in most acids but can be electro-etched using one or more of the aforementioned acids since the dissolution rate is controlled by current and potential. However, a Co—Fe-based alloy that undergoes dissolution in acids like sulfuric and TFMSA should not be electro-etched in such acids since they do not require current, and thus there will be a large amount of undercut or lateral etching under the mask. Thus, Co—Fe-based alloys should be etched in comparatively weaker acids such as citric and acetic acids and possibly phosphoric acids. Thus, the particular electrolyte solution used for the electro-etching may be tailored to the type of magnetic material being etched. In some embodiments, as a general principle, the electro-etching should be carried out in electrolytes that have low or insignificant background chemical etch rates.

The degree or slope of the undercut for the patterned magnetic features 902 may be controlled by adjusting the electrolyte solution utilized. For example, certain additives may be used in the electrolyte solution to control the solution and potential and thus the tapered edge of the patterned magnetic features 902. Such additives may include benzotriazole and related family compounds in some embodiments. In some embodiments, there should only be undercut due to electro-etching assuming little or no parallel chemical dissolution, excluding Galvanic-driven chemical dissolution. In some embodiments, the extent of the undercut is proportional to the thickness of the magnetic film. Additives, such as benzotriazole and related family compounds, may be used in the electrolyte solution in some embodiments to slow the etch rate in small areas such as near a mask edge by non-planar diffusion. Such additives, however, would have only a small effect on the field area etch rate (i.e., they should not decrease significantly the electro-etch rates in field areas away from the mask edges).

In some embodiments, a dielectric laminate may be formed over the patterned magnetic features 902 by controlling the electrolyte solution used in the electro-etching. For example, to form dielectric laminated magnetic films, HF may be added into the electrolyte solution. The concentration or amount of HF acid may control the thickness of the thin dielectric film etched in the patterned magnetic features 902. For example, a concentration of 0.5-1% may be used in some embodiments to form a thin dielectric film of less than 100 nm over the patterned magnetic features 902.

FIG. 10 shows a side cross-sectional view 1000 of the FIG. 9 structure following removal of the seed layer 204, such that the patterned magnetic features 902 remain on the substrate 202.

The processing described above with respect to FIGS. 2-10 for patterning magnetic films using self-stopping electro-etching may be used in fabricating various types of devices. FIGS. 11-15 illustrate the use such processing in forming a closed-yoke inductor, while FIGS. 16-18 illustrate use of such processing in the formation of a solenoid inductor. It is to be appreciated, however, that embodiments are not limited to these use cases. Instead, the processing described above with respect to FIGS. 2-10 may be used in various other types of devices where it is desired to form patterned magnetic features.

FIG. 11 shows a side cross-sectional view 1100 of a substrate 1102 with wiring 1104 formed thereon and surrounded by dielectric 1106. The substrate 1102 may be a Si wafer similar to that of substrate 202. The substrate 1102, in some embodiments, includes front-end gallium nitride (GaN) and Si transistors with a standard back-end. The transistors and other circuit parts may be front-end-of-line (FEOL) and are not shown in FIG. 11, as magnetic layers are typically built on the far back-end-of-line (BEOL). This, however, is not a requirement as the magnetic layers may be formed in the FEOL if desired. Wiring 1104 may be Cu, although other suitable materials may be used for the back-end-of-line interconnect wiring. The dielectric 1106 may be formed of silicon oxide or another suitable material and may have a thickness in the range of 100 nm-5000 nm in some embodiments. Inductors are built after the dielectric 1106 is formed, with the dielectric 1106 insulating magnetic layers or features from the bottom structures.

FIG. 12 shows a side cross-sectional view 1200 of the FIG. 11 structure following formation of a bottom yoke 1202 of an inductor. The bottom yoke 1202 may be formed using the self-stopping electro-etching techniques described above with respect to FIGS. 2-10. For example, seed and protect layers may be formed over the dielectric 1106, followed by sputtering of a magnetic film, patterning using photoresists and self-stop electro-etching to pattern the bottom yoke 1202 followed by removal of the photoresist, seed and protect layers.

The bottom yoke 1202 may have a thickness in the range of 1-10 μm in some embodiments. Also shown in FIG. 12, a dielectric layer 1204 is formed over the bottom yoke 1202. The dielectric layer 1204, similar to dielectric 1106, may be formed of silicon oxide or another suitable material and may have a thickness in the range of 1-5 μm.

Figure 13:
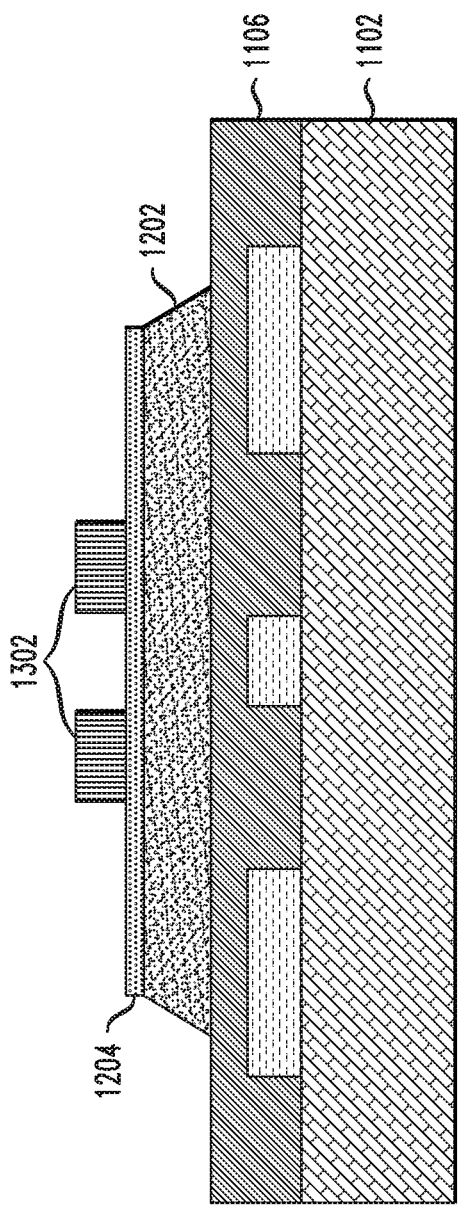
FIG. 13 depicts a side cross-sectional view of the FIG. 12 structure following formation of wiring over a dielectric film formed on the bottom yoke, according to an embodiment of the present invention.

FIG. 13 shows a side cross-sectional view 1300 of the FIG. 12 structure following formation of wiring 1302 over the dielectric layer 1204. The wiring 1302, similar to the wiring 1104, may be Cu. Formation of the wiring 1302 may include patterning via photoresist, RIE to open vias, sputtering a seed layer, plating Cu wire and removing the photoresist and seed layer. The wiring 1302 may have a width in the range of 10-500 μm and a thickness in the range of 1-15 μm in some embodiments.

Figure 14:
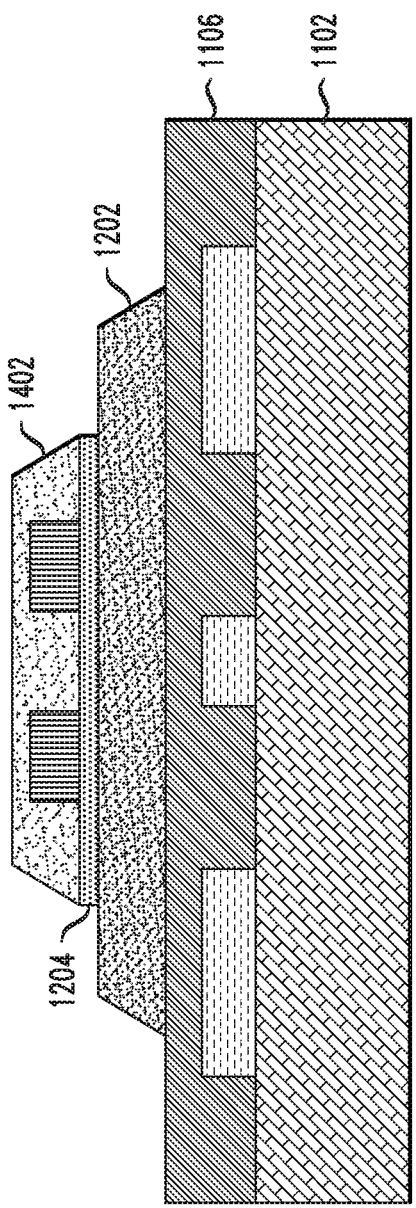
FIG. 14 depicts a side cross-sectional view of the FIG. 13 structure following formation of a protect layer over the wiring and opening of a magnetic via to the bottom yoke, according to an embodiment of the present invention.

FIG. 14 shows a side cross-sectional view 1400 of the FIG. 13 structure following formation of a protect layer 1402 over the wiring 1302. The protect layer 1402 may be formed of hard-baked photoresist or polyimide in some embodiments. The protect layer may have a thickness in the range of 1-20 μm in some embodiments.

Figure 15:
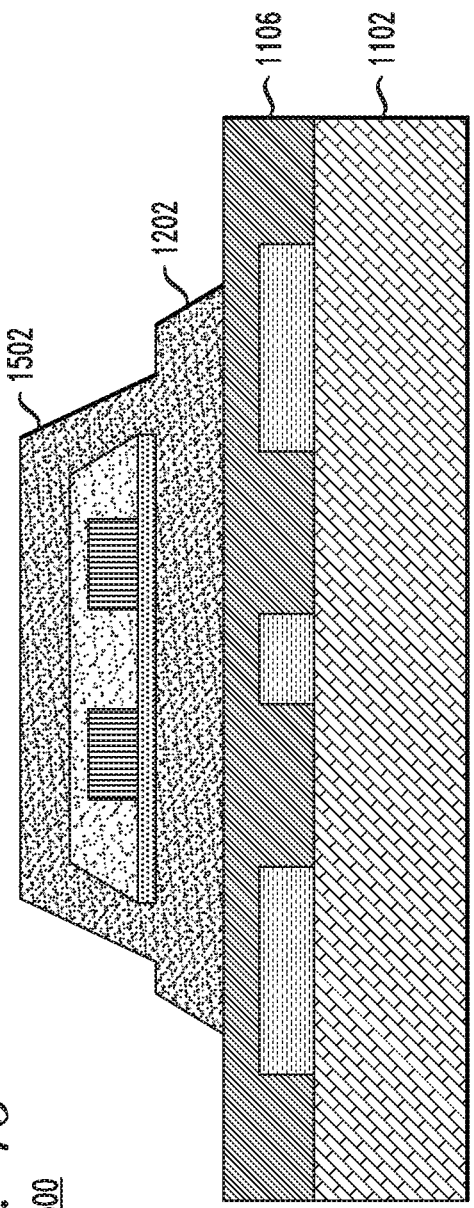
FIG. 15 depicts a side cross-sectional view of the FIG. 14 structure following formation of a top yoke utilizing self-stopping electro-etching of magnetic material, according to an embodiment of the present invention.
Figure 16:
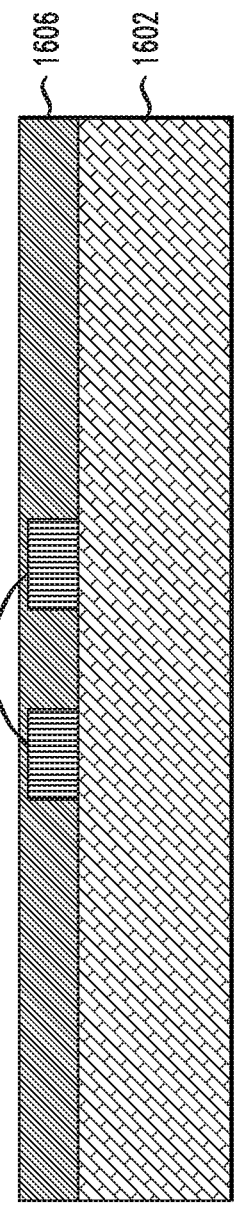
FIG. 16 depicts a side cross-sectional view of a substrate having one or more transistors formed thereon with the transistors and top surface of the substrate surrounded by a dielectric layer, according to an embodiment of the present invention.

FIG. 15 shows a side cross-sectional view 1500 of the FIG. 14 structure following formation of a top yoke 1502 of an inductor. The top yoke 1502 may be deposited and patterned in a manner similar to that described above with respect to the bottom yoke 1202, namely, utilizing the self-stopping electro-etching techniques described above with respect to FIGS. 2-10. The top yoke 1502 and bottom yoke 1202 together with wiring 1302 form a closed-yoke inductor. The closed-yoke inductor, although not explicitly shown in FIG. 15, may be encapsulated with dielectrics and patterned and plated for controlled-collapse chip connection (C4) solder.

FIG. 16 shows a side cross-sectional view 1600 of substrate 1602 with wiring 1604 formed thereon and surrounded by dielectric 1606. The materials and sizing of the substrate 1602, wiring 1604 and dielectric 1606 may be similar to that used for substrate 1102, wiring 1104 and dielectric 1106, respectively.

FIG. 17 shows a side cross-sectional view 1700 of the FIG. 16 structure following formation of a magnetic core 1702 over the dielectric layer 1606. The magnetic core 1702 may be formed in a manner similar to that described above with respect to bottom yoke 1202, namely, utilizing the self-stopping electro-etching process of FIGS. 2-10. Also shown in FIG. 17 is a dielectric layer 1704 formed over the magnetic core 1702. The materials and sizing of the magnetic core 1702 and dielectric layer 1704 may be similar to that of the bottom yoke 1202 and dielectric layer 1204, respectively.

FIG. 18 shows a side cross-sectional view 1800 of the FIG. 17 structure following formation of wiring 1802 over the dielectric layer 1704. The material and sizing of the wiring 1802 may be similar to that of the wiring 1302. The structure shown in FIG. 18 provides a solenoid inductor. The solenoid inductor, although not explicitly shown in FIG. 18, may be encapsulated with dielectrics and patterned and plated for C4 solder.

In some embodiments, a method of forming a semiconductor structure comprises forming a seed layer over a top surface of a substrate and a protect layer over a top surface of the seed layer, forming a magnetic film on a top surface of the protect layer and a top surface of the substrate in at least one opening formed in the seed layer and the protect layer, and forming at least one patterned magnetic feature on the top surface of the substrate by electro-etching the magnetic film, wherein the seed layer provides a self-stop for the electro-etching of the magnetic film.

In some embodiments, the seed layer comprises Cu and the protect layer comprises Ta. The protect layer may form a TaOx surface when contacting an electrolyte solution utilized in electro-etching the magnetic film. The TaOx surface of the protect layer prevents the Cu seed layer from being etched during the electro-etching of the magnetic film.

In some embodiments, the seed layer and the protect layer are formed continuous across the top surface of the wafer. In such embodiments, the method for forming the semiconductor structure also comprises forming the at least one opening by patterning the seed layer and the protect layer utilizing at least one of reactive-ion etching and wet etching.

The magnetic film may be formed by sputtering a magnetic material. Forming the at least one patterned magnetic feature may comprise patterning a photoresist layer to cover a portion of the magnetic film formed over the at least one opening in some embodiments. Electro-etching the magnetic film undercuts the photoresist layer as the magnetic film is removed from a top surface of the protect layer. Electro-etching the magnetic film continues to undercut the photoresist layer after the magnetic film is completely removed from the top surface of the protect layer in some embodiments. Electro-etching the magnetic film stops when the undercut results in a gap between the magnetic film and the seed layer in some embodiments. The photoresist layer, protect layer and seed layer may be removed following the self-stop of the electro-etching of the magnetic film.

The at least one patterned magnetic feature may comprise undercut sidewalls in some embodiments. The undercut sidewalls of the at least one patterned magnetic feature may form a gap between the at least one patterned magnetic feature and the seed layer during the electro-etching of the magnetic film. A slope of the undercut sidewalls may be controlled by introducing additives to the electrolyte solution used for the electro-etching. The additives may comprise benzotriazole in some embodiments. In some embodiments, the electro-etching may utilize an electrolyte solution comprising HF to form a dielectric laminate over the at least one patterned magnetic feature.

In some embodiments, a semiconductor structure comprises a substrate and at least one patterned magnetic feature formed over the top surface of the substrate. The at least one patterned magnetic feature comprises undercut sidewalls formed from an electro-etching of a magnetic film formed over the top surface of the substrate in an opening formed in a seed layer. The undercut sidewalls of the at least one patterned magnetic feature provide a gap between the magnetic film and the seed layer formed over the top surface of the substrate to self-stop the electro-etching.

The at least one patterned magnetic feature may comprise a bottom yoke and a top yoke surrounding a protect layer in which first wiring is formed in some embodiments. The bottom yoke and the top yoke in such embodiments may form a closed-yoke inductor with the first wiring.

In some embodiments, the semiconductor structure further comprises first wiring surrounded by a dielectric layer formed over the top surface of the substrate between the top surface of the substrate and the at least one patterned magnetic feature. The semiconductor structure may further comprise second wiring formed over a dielectric layer formed on a top surface of the at least one patterned magnetic feature. The at least one patterned magnetic feature in such embodiments may comprise a magnetic core for a solenoid inductor comprising the first wiring and the second wiring.

In some embodiments, an integrated circuit comprises a substrate and at least one patterned magnetic feature formed over the top surface of the substrate. The at least one patterned magnetic feature comprises undercut sidewalls formed from an electro-etching of a magnetic film formed over the top surface of the substrate in an opening formed in a seed layer. The undercut sidewalls of the at least one patterned magnetic feature provide a gap between the magnetic film and the seed layer formed over the top surface of the substrate to self-stop the electro-etching.

In the description above, various materials and dimensions for different elements are provided. Unless otherwise noted, such materials are given by way of example only and embodiments are not limited solely to the specific examples given. Similarly, unless otherwise noted, all dimensions are given by way of example and embodiments are not limited solely to the specific dimensions or ranges given.

Semiconductor devices and methods for forming same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require, for example, complementary metal-oxide semiconductors (CMOS s), metal-oxide-semiconductor field-effect transistors (MOSFETs), and/or FinFETs. By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
   a substrate;
   at least one patterned magnetic feature disposed over a top surface of the substrate;
   wherein said at least one patterned magnetic feature comprises a magnetic material;
   wherein said at least one patterned magnetic feature comprises undercut sidewalls, the undercut sidewalls providing a self-stop for electro-etching of the magnetic material;
   wherein the undercut sidewalls provide a gap between the magnetic material and a seed layer disposed over the top surface of the substrate; and
   a protect layer disposed over a top surface of the seed layer.

2. The semiconductor structure of claim 1, wherein the seed layer comprises copper (Cu) and the protect layer comprises tantalum (Ta).

3. The semiconductor structure of claim 2, wherein the protect layer comprises a tantalum oxide (TaOx) surface.

4. The semiconductor structure of claim 3, wherein the TaOx surface prevents the Cu seed layer from being etched during electro-etching of the magnetic film.

5. The semiconductor structure of claim 1, wherein the magnetic material comprises a soft magnetic metal.

6. The semiconductor structure of claim 1, wherein the magnetic material comprises at least one of a nickel-iron (Ni—Fe) alloy, a cobalt-iron (Co—Fe) alloy, a nickel-cobalt-iron (Ni—Co—Fe) alloy, a cobalt-iron-boron (Co—Fe—B) alloy, a cobalt-zirconium-tantalum (Co—Zr—Ta) alloy, a cobalt-zirconium-titanium (Co—Zr—Ti) alloy, and a cobalt-zirconium-iron-boron (Co—Zr—Fe—B) alloy.

7. The semiconductor structure of claim 1, wherein a slope of the undercut sidewalls of the at least one patterned magnetic feature is controlled by additives in an electrolyte solution used for the electro-etching.

8. The semiconductor structure of claim 7, wherein the additives comprise benzotriazole.

9. The semiconductor structure of claim 1, further comprising a dielectric laminate disposed over said at least one patterned magnetic feature.

10. The semiconductor structure of claim 1, wherein said at least one patterned magnetic feature forms at least a portion of a closed-yoke inductor.

11. The semiconductor structure of claim 10, wherein said at least one patterned magnetic feature comprises a bottom yoke and a top yoke surrounding a protect layer in which first wiring is disposed, the bottom yoke and the top yoke forming the closed-yoke inductor with the first wiring.

12. The semiconductor structure of claim 1, wherein said at least one patterned magnetic feature forms at least a portion of a solenoid inductor.

13. The semiconductor structure of claim 12, further comprising:
   first wiring surrounded by a dielectric layer disposed over the top surface of the substrate between the top surface of the substrate and said at least one patterned magnetic feature; and second wiring formed over a dielectric layer disposed on a top surface of said at least one patterned magnetic feature;

wherein the solenoid inductor comprises the first wiring, the second wiring and a magnetic core provided by said at least one patterned magnetic feature.

14. An integrated circuit comprising:
a semiconductor structure comprising:
   a substrate; and
   at least one patterned magnetic feature disposed over a top surface of the substrate;
wherein said at least one patterned magnetic feature comprises a magnetic material;
wherein said at least one patterned magnetic feature comprises undercut sidewalls, the undercut sidewalls providing a self-stop for electro-etching of the magnetic material;
wherein the undercut sidewalls provide a gap between the magnetic material and a seed layer disposed over the top surface of the substrate; and
wherein the semiconductor structure further comprises a protect layer disposed over a top surface of the seed layer.

15. The integrated circuit of claim 14, wherein the semiconductor structure comprises a closed-yoke inductor.

16. The integrated circuit of claim 15, wherein said at least one patterned magnetic feature comprises a bottom yoke and a top yoke surrounding a protect layer in which first wiring is disposed, the bottom yoke and the top yoke forming the closed-yoke inductor with the first wiring.

17. The integrated circuit of claim 14, wherein the semiconductor structure comprises a solenoid inductor.

18. The integrated circuit of claim 17, wherein the semiconductor structure further comprises:
   first wiring surrounded by a dielectric layer disposed over the top surface of the substrate between the top surface of the substrate and said at least one patterned magnetic feature; and
   second wiring formed over a dielectric layer disposed on a top surface of said at least one patterned magnetic feature;
wherein the solenoid inductor comprises the first wiring, the second wiring and a magnetic core provided by said at least one patterned magnetic feature.

19. The integrated circuit of clam 14, wherein the seed layer comprises copper (Cu) and the protect layer comprises tantalum (Ta).

20. The integrated circuit of claim 19, wherein the protect layer comprises a tantalum oxide (TaOx) surface.

* * * * *